March 29, 1960 J. R. KOBBE ET AL 2,930,986

DISTRIBUTED AMPLIFIER

Filed Feb. 29, 1956

INVENTOR.
JOHN R. KOBBE
WILLIAM J. POLITS
BY
Buckhorn and Cheatham
ATTORNEYS

United States Patent Office 2,930,986
Patented Mar. 29, 1960

2,930,986

DISTRIBUTED AMPLIFIER

John R. Kobbe and William J. Polits, Beaverton, Oreg., assignors to Tektronix, Inc., Portland, Oreg., a corporation of Oregon Application February 29, 1956, Serial No. 568,489

3 Claims. (Cl. 330—54)

This invention relates to a distributed amplifier and more particularly to such an amplifier which is capable of working into a high impedance load and which at the same time has high gain and D.C. response and also wide band frequency response with gradually decreasing amplification as the frequency increases so as to provide a smooth frequency response characteristic.

Distributed amplifiers contain the equivalent of two artificial transmission lines, a control grid line and a plate line, along which a signal voltage will travel in either direction. The two lines need not have the same characteristic impedance but for effective amplification should have the same velocity of signal propagation.

For wide band amplifiers, it has heretofore been considered necessary to terminate both ends of the control grid and plate lines with resistors having values of resistance equal to the characteristic impedances of the respective lines in order to prevent reflection of electrical energy from the ends of such lines with resultant undesirable frequency response characteristics. Well designed distributed amplifiers with both ends of their control grid and plate lines terminated with such resistors have wide band frequency response characteristics of a form particularly desirable for supplying signal voltages to the vertical deflection plates of the cathode ray tube of a wide frequency band cathode ray oscilloscope. The plate line of such an amplifier, however, has a characteristic impedance of the order of a few hundred ohms, whereas the deflection plates of a cathode ray tube constitute a very high impedance load and a shunting resistor having the low value of resistance heretofore considered necessary to terminate the output end of the plate line unduly reduces the gain of the amplifier. Since the amplifier of the present invention has D.C. response, any effective terminating resistor for the reverse end of the plate line must absorb considerable D.C. power, as well as signal power, and trouble has been experienced in designing a resistor which has sufficient wattage and which still has other suitable electrical characteristics. Attempts to employ a simple resistor having the requisite power dissipation at the reverse end of the line with the output end of the plate line terminated in a high impedance has resulted in unusable frequency and transient response characteristics. The response characteristic has a number of peaks and valleys therealong and the transient response has irregularities therein. The frequencies at the peaks in the frequency response characteristic are of the order of megacycles and such peaks are caused by the failure of the resistor at the reverse end of the plate line to completely absorb the reflected energy having such frequencies.

In accordance with the present invention the amplifier is provided with a terminating impedance at the reverse end of the plate line which will substantially completely absorb the signal energy reflected from the output end of the line when such output end is connected to a high impedance load and which will also absorb any signal energy traveling along the line in the same direction as the reflected energy. The terminating impedance of the amplifier of the present invention has a total resistance equal to the characteristic impedance of the plate line but such resistance is divided between a plurality of line sections having values of series resistance and inductance and values of shunt capacitance which cause absorption of signal energy having any frequency within the band width of the amplifier. The result is a distributed amplifier capable of impressing a signal voltage on a high impedance terminating load while at the same time having D.C. response and a wide band frequency response with gradual decrease in amplification with increase of frequency, and also having excellent transient response.

It is therefore an object of the present invention to provide a distributed amplifier capable of having the output end of its plate line terminated with a high impedance load while maintaining D.C. and wide band frequency response which gradually decreases as the frequency increases.

Another object of the invention is to provide a wide band distributed amplifier capable of supplying a high impedance load as a terminating impedance of its plate line while having excellent response for transient signal voltages.

Another object of the invention is to provide a terminating impedance for the reverse end of the plate line of a wide frequency band distributed amplifier which will substantially completely absorb signal energy traveling toward such impedance and having any frequency within the band width of the amplifier.

A further object of the invention is to provide a wide frequency band distributed amplifier in which a terminating impedance at the reverse end of the plate line has a plurality of line sections having values of shunt capacitance and value of series resistance and inductance which will absorb substantially all signal energy traveling toward such impedance along the plate line.

Other objects and advantages will appear in the following description of a preferred embodiment of the invention shown in the attached drawings of which:

Figure 1:
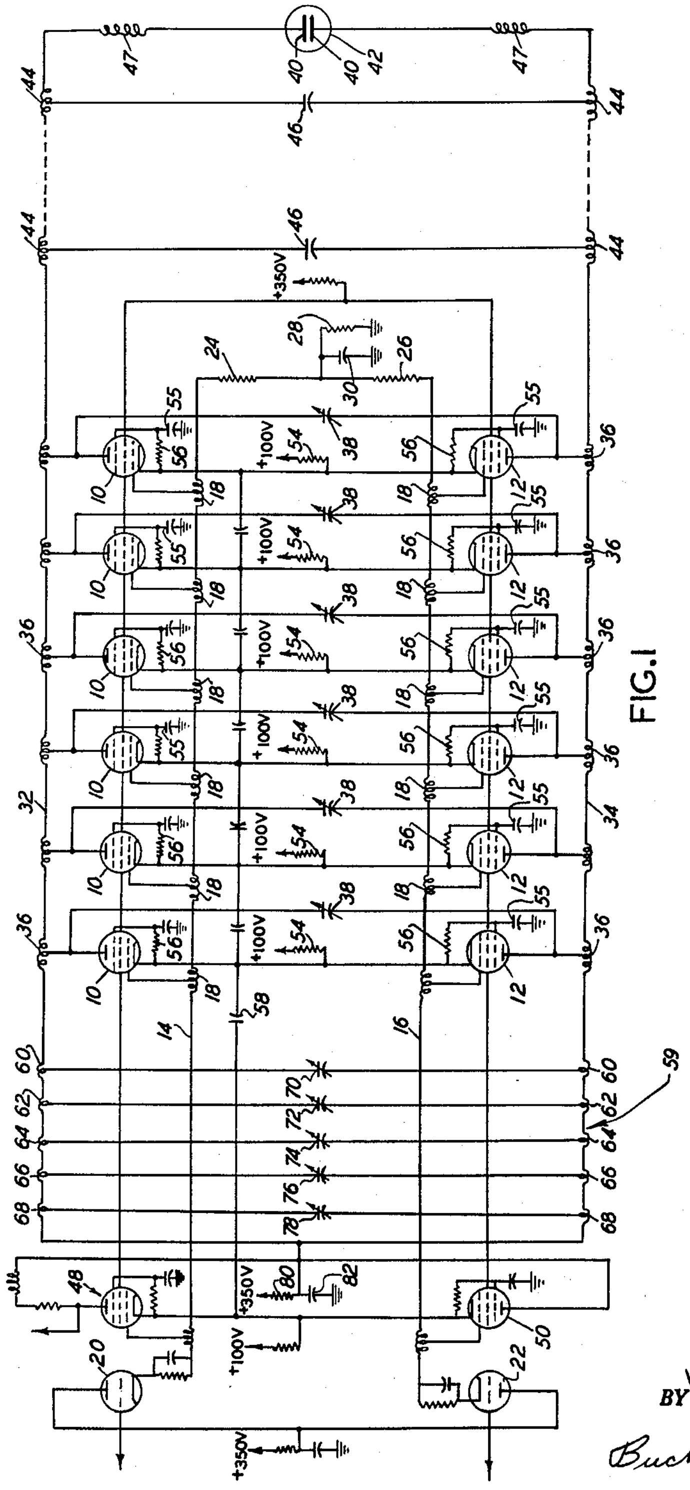
Fig. 1 is a schematic diagram of a distributed amplifier in accordance with the present invention with input and output circuits connected thereto.

Referring more particularly to the drawings, the amplifier of the present invention is shown as being arranged for push pull operation and includes a plurality of amplifier tubes 10 and 12. The tubes 10 are connected in one side of the push pull circuit and the control girds thereof are supplied with signal energy through a control grid line 14. The tubes 12 are connected in the other side of the push pull circuit and have their control grids supplied with signal energy through a control grid line 16. The lines 14 and 16 have a plurality of small center tapped inductors 18 in series therein, one for each of the tubes 10 and 12, and the control grids of such tubes are connected to the center taps of the corresponding inductors. The inductance thus provided in conjunction with the capacitance to ground of the control grids of the tubes 10 and 12 form an artificial transmission line for each side of the push pull circuit along which signal energy will travel in either direction with a definite propagation velocity. Each of such control grid lines has a characteristic impedance which in the symmetrical circuit shown are equal. In a typical circuit, the characteristic impedance of each control grid line may, for example, be 390 ohms.

The input end of the control grid lines 14 and 16 are supplied with signal energy from tubes 20 and 22, respectively, such tubes being connected as cathode followers. The cathode loads for the tubes 20 and 22 are resistors 24 and 26, respectively, at the other end of the control grid lines 14 and 16, the resistors 24 and 26 being connected in series with such lines and to ground through a bias resistor 28 and a by-pass capacitor 30. The resistors 24 and 26 may each have a value of resistance equal to the characteristic impedance of the grid lines 14 and 16 and the cathode followers employed to supply the signal to the grid lines may be made to have a cathode impedance of the same order as the characteristic impedance of the grid lines by proper choice of the type of tubes and of the values of the other circuit components. The control grid circuits of such tubes are not shown but it will be understood that a push pull signal voltage will be impressed across the control grids of the tubes 20 and 22. In the particular circuit shown, the control grids of the tubes 20 and 22 are held at an average positive D.C. voltage of approximately 200 volts by such grid circuits. By thus terminating both ends of the control grid lines with impedances substantially equal to the characteristic impedance of such lines, reflection of signal energy from the ends of such lines is substantially eliminated.

The plates of the tubes 10 and 12 are connected to a source of positive voltage through plate lines 32 and 34, respectively, such lines having a plurality of small center tapped inductors 36 in series therein, one for each tube 10 and 12, and the plates of such tubes are connected to the center taps of the corresponding inductors 36. The inductance thus provided in conjunction with the plate to ground capacitance of the tubes 10 and 12 and in conjunction with the capacitance of small adjustable capacitors 38 connected between the plates of corresponding tubes 10 and 12 on opposite sides of the push pull circuit, constitute two artificial transmission lines, each having a characteristic impedance and a definite rate of signal propagation. The rate of signal propagation of the plate lines 32 and 34 should be the same as that of the control grid lines 14 and 16 but the characteristic impedance may vary from that of the control grid lines and in the circuit shown may, for example, be 600 ohms. The characteristic impedance of each section of the plate lines 32 and 34 should be the same to avoid reflections and such characteristic impedance can be adjusted by adjusting the capacitors 38. The signal on the plate lines travels at the same rate as the input signal on the control grid lines and is augmented at each tube 10 or 12 so that an amplified signal is present across the output end of the plate lines. With the amplifier of the present invention, such signal can be directly applied to a high impedance load such as the vertical deflection plates 40 of a cathode ray tube 42, without employing a shunting resistor having a value of resistance equal to the characteristic impedance of the plate lines.

In a cathode ray oscilloscope, for which the present amplifier is particularly useful, the amplified signal may be applied to the deflection plates 40 through a delay line having a large number of sections, of which only the input and output sections are indicated in the drawing as being made up of series center tapped inductors 44 and shunt capacitors 46 connected between the center taps of corresponding inductors 44. The connection to the deflection plates will usually also include small inductors 47 in series therewith to compensate for the capacitance of the deflection plates 40. Such delay line should have a characteristic impedance matching that of the plate lines of the amplifier and provides time for a sweep to be established in the cathode ray tube before a transient signal voltage from the amplifier of the present invention reaches the vertical deflection plates. The tubes 48 and 50 provide a take off for a trigger voltage for establishing such sweep, the trigger voltage being developed between the plate of the tube 48 and ground. The tubes 48 and 50 have their control grids connected to the control grid lines 14 and 16, respectively, in the same manner as the control grids of the tubes 10 and 12 but are independent of the plate lines 32 and 34.

The tubes 10, 12, 48 and 50, may all be of the same type and may, for example, be pentodes with their screen grids all connected together and to a source of positive voltage through a resistor. The cathodes of corresponding tubes on opposite side of the push pull circuit are connected together and to a source of positive voltage through separate resistors 54, the cathodes being connected to such source in order to provide a negative bias for the control grids of the tubes. In the particular circuit shown the control grids of the tubes 10, 12, 48 and 50 are at a positive potential with respect to ground, because of their direct current connection to the cathodes of the cathode follower tubes 20 and 22. The suppressor grids of the tubes 10, 12, 48 and 50 are connected to ground through by-pass capacitors 55 and held at substantially the same direct current potential as the cathodes of the respective tubes by resistors 56. Also, the cathodes of adjacent pairs of tubes 10, 12, 48 and 50 are connected together through small capacitors 58 in order to prevent parasitic oscillations.

The terminating impedance 59 of the present invention for the reverse end of the plate line includes a plurality of small center tapped inductors 60, 62, 64, 66 and 68 connected in series with each plate line and a plurality of small adjustable capacitors 70, 72, 74, 76 and 78 connected in shunt between the center taps of corresponding inductances of the two lines. The ends of the inductors 68, remote from the amplifier tubes 10 ad 12, are connected together and then connected to the source of positive voltage for the plates of such tubes through a resistor 80 and to ground through a by-pass capacitor 82. The inductors 60 to 68 inclusive, are wound with resistance wire so as to also constitute resistors and the sum of the resistance of the series of inductors 60 to 68 in series in each plate line is equal to the characteristic impedance of such plate line. Also, the values of inductance and capacitance of the various sections are such that each section has a characteristic impedance which is approximately equal to the characteristic impedance of the plate lines less the series resistance between it and the plate lines. Also, the cutoff frequency of each such section is approximately the same as that of each section of the plate lines. To accomplish this, the inductors 60 to 68 are wound so that the values of inductance and resistance of the various inductors decrease in accordance with an approximate geometrical progression as the inductors become more remote from the amplifier tubes 10 and 12 and similarly the value of capacitance of the capacitors 70 to 78 increases in accordance with a similar approximate geometrical progression as the capacitors become more remote from the amplifier tubes.

In the particular circuit shown a value of 1.6 was selected as the multiplying factor for the geometrical progression, such that the inductance and resistance of inductor 62 are 1.6 times the inductance and resistance, respectively, of inductor 64 etc., and similarly the capacitance of capacitor 74 at its median adjustment is approximately 1.6 times the corresponding capacitance of capacitor 72 etc. A true geometrical progression would require an infinite number of sections and an approximation has been made in the last section, i.e., the section most remote from the amplifying tubes by making the inductance and resistance of the inductor 68 thereof of the same values respectively as those of the inductor 66 of the next to the last section and by making the capacitance of the capacitor 78 of the last section approximately 10 times that of the capacitor 76 of the next to the last section. Other approximations can be made, such as substituting conventional resistors having the same resistance values for the inductors 68 of the last stage and the elimination of capacitor 78. The values of inductance of the inductors 60, 62, 64, 66 and 68 in the circuit shown may, for example, be 1.7, 1.2, .8, .5 and .5 microhenries, respectively, and the corresponding values of resistance may be 200, 140, 100, 80 and 80 ohms, respectively, or a total of 600 ohms. The approximate adjusted values of capacitance of the capacitors 70, 72, 74, 76 and 78 may be 3.4, 5.5, 9, 15 and 150 micromicrofarads, respectively. By adjustment of such capacitors, the terminating impedance, just described, may be made to substantially completely absorb all signal energy which travels along the plate lines toward such terminating impedance. The power dissipation properties of the terminating impedance may easily be made sufficient that D.C. energy, as well as signal energy, is absorbed and radiated as heat without undue rise in temperature and, in fact, the terminating impedance may be considered a wire wound resistor incorporating tuned circuits.

Figure 3:
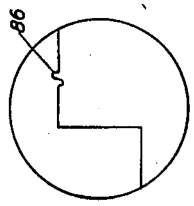
Fig. 3 is a view, similar to Fig. 2, showing the form of trace obtained when the reverse end of the plate line of the amplifier is not correctly terminated.
Figure 2:
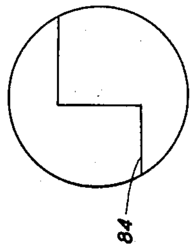
Fig. 2 is a diagrammatic view illustrating a desired form of trace on the cathode ray tube of a cathode ray oscilloscope connected to the amplifier of the present invention when a step function signal voltage is applied to the input of such amplifier.

When a step function signal voltage is applied to the input terminals of the amplifier, the desired form of trace on the cathode ray oscilloscope tube connected thereto and provided with a proper sweep is shown at 84 in Fig. 2. Such form of trace is obtained when the capacitors 70 to 78, inclusive, of Fig. 1 are properly adjusted and the amplifier is otherwise in proper adjustment. If the capacitors 70 to 78 are not properly adjusted, the trace will have an irregularity 86, such as indicated in Fig. 3, at a distance on a time scale from the rise of the step function voltage which is equivalent to two times the time delay of the plate line including that of any delay line between the amplifier and the vertical deflection plates of the cathode ray tube. A similar irregularity occurs when it is attempted to employ a simple resistor for terminating the reverse end of the plate line, which resistor has a power dissipation equal to that of the terminating impedance above described. By adjusting each of the capacitors 70 to 78 in a direction decreasing the irregularity 86 of Fig. 3, such irregularity can be eliminated indicating that substantially no signal energy is being reflected from the reverse end of the plate line. The transient response becomes excellent and at the same time it will be found that the peaks, discussed above, in the frequency response characteristic of the amplifier have substantially disappeared such that the response of the amplifier gradually decreases along a smooth curve from zero frequency as the frequency increases so as to be down approximately 3 decibels at 30 megacycles and has substantial response up to 60 megacycles or more.

While the distributed amplifier of the present invention has been shown in push pull form, such amplifier can be easily converted to a single ended form by eliminating one set of tubes, such as the tubes 12, 22 and 50, and their associated circuits, it being understood that adjustments will have to be made in the values of voltage dropping resistors in the power supply circuit. The capacitors 38, as well as the capacitors 70 to 78, can be connected to ground if their values of capacitance are doubled. The cathodes, as well as the grid line termination, should also be connected to zero impedance voltage sources. The result is a single ended amplifier capable of supplying a signal voltage to a high impedance load as a termination for the plate line, while providing excellent transient response and wide band frequency response with a smoothly decreasing frequency response characteristic. While center tapped inductors 60 to 68 have been shown in the terminating impedance 59, it is also possible to employ separate inductors wound of resistance wire or separate inductors and resistors between the points of connection to the shunt capacitors 70 to 78 to secure energy absorbing characteristics approaching that of the preferred embodiment above described.

We claim:

1. A distributed amplifier comprising a plurality of amplifying devices each having electrodes including a control electrode and an output electrode means for supplying signal energy in time sequence to the control electrodes of said devices, an output transmission line connected to the output electrodes of said devices for receiving amplified signal energy successively from said devices and having an output end and a reverse end, said line having said output end terminated with an impedance differing in value from that of the characteristic impedance of said line so as to reflect signal energy along said line toward said reverse end, and a terminating circuit for the reverse end of said line for absorbing substantially all signal energy traveling along said line toward said circuit, said circuit including a plurality of transmission line sections each including a series portion containing resistance and inductance in series with said line and each including a shunt portion across said line and containing capacitance in series with said shunt portion, said series portions having a total resistance in series with said line substantially equal to the characteristic impedance of said line, the values of said resistance of each of said line sections decreasing for line sections more remote from said devices.

2. A distributed amplifier comprising a plurality of electron discharge tubes each having a plate, a cathode and a control grid, means for supplying signal energy in time sequence to the control grids of said tubes, a plate transmission line connected to the plates of said tubes for receiving amplified signal energy successively from said plates and having an output end and a reverse end, said line having said output end terminated in an impedance differing in value from that of the characteristic impedance of said line so as to reflect signal energy along said line toward said reverse end, and a terminating circuit for the reverse end of said line for absorbing substantially all of the signal energy traveling along said line toward said circuit, said circuit including a plurality of transmission line sections each having a series portion containing resistance and inductance in series with said line and each having a shunt portion across said line and containing capacitance in series with said shunt portion, said series portions of said line sections having a total resistance in series with said line substantially equal to the characteristic impedance of said line, the values of said resistance of each of said line sections decreasing for line sections more remote from said devices.

3. A distributed amplifier comprising a plurality of amplifying devices each having electrodes including a control electrode and an output electrode, means for supply signal energy in time sequence to the control electrodes of said devices, an output transmission line connected to the output electrodes of said devices for receiving amplified signal energy successively from said devices and having an output end and a reverse end, said line having said output end terminated with an impedance differing in value from that of the characteristic impedance of said line so as to reflect signal energy along said line toward said reverse end, and a terminating circuit for the reverse end of said line for absorbing substantially all signal energy traveling along said line toward said circuit, said circuit including a plurality of transmission line sections each having the characteristic impedance of said line and including a series portion containing resistance and inductance in series with said line and each including a shunt portion across said line and containing capacitance in series with said shunt portion, said series portions having a total resistance in series with said line substantially equal to the characteristic impedance of said line, the values of resistance and inductance of each of said line sections decreasing and the values of said capacitance increasing in accordance with an approximate geometrical progression as said line sections become more remote from said devices.

(References on following page)

References Cited in the file of this patent

UNITED STATES PATENTS

| | | |
|---|---|---|
| 2,778,887 | Bradley | Jan. 22, 1957 |

FOREIGN PATENTS

| | | |
|---|---|---|
| 460,562 | Great Britain | Jan. 25, 1937 |

OTHER REFERENCES

Publication: Electronic Engineering, vol. XXIV, Issue 290, pages 144–147, April 1952, Distributed Amplification" by A. Cormack.

Publication: Electronics, vol. 25, Issue 1, pages 128–131, January 1952, "Short Pulse Amplifiers" by George F. Meyers.

Publication: Electronics, July 1952, pages 113–115, 121–123, "Distributed Amplifier" by Scharfman.

Disclaimer 2,930,986.—*John R. Kobbe* and *William J. Polits*, Beaverton, Oreg. DISTRIBUTED AMPLIFIER. Patent dated Mar. 29, 1960. Disclaimer filed Feb. 21, 1966, by the assignee, *Tektronix, Inc.*

Hereby enters this disclaimer to claim 3 of said patent.

[*Official Gazette May 31, 1966.*]